(12) United States Patent
Shibata et al.

(10) Patent No.: US 6,623,998 B2
(45) Date of Patent: Sep. 23, 2003

(54) METHOD FOR MANUFACTURING GROUP III NITRIDE COMPOUND SEMICONDUCTOR DEVICE

(75) Inventors: Naoki Shibata, Nishikasugai-gun (JP); Toshiaki Chiyo, Nishikasugai-gun (JP); Masanobu Senda, Nishikasugai-gun (JP); Jun Ito, Nishikasugai-gun (JP); Hiroshi Watanabe, Nishikasugai-gun (JP); Shinya Asami, Nishikasugai-gun (JP); Shizuyo Asami, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 10/304,033

(22) Filed: Nov. 26, 2002

(65) Prior Publication Data

US 2003/0085411 A1 May 8, 2003

Related U.S. Application Data

(63) Continuation of application No. 09/888,519, filed on Jun. 26, 2001, which is a continuation-in-part of application No. 09/658,586, filed on Sep. 8, 2000, now abandoned.

(30) Foreign Application Priority Data

Sep. 29, 1999 (JP) ........................... P.11-276556
Feb. 18, 2000 (JP) ........................... P.2000-041222
Jun. 26, 2000 (JP) ........................... P.2000-191779

(51) Int. Cl.⁷ ............................................. H01L 21/00
(52) U.S. Cl. .............................. 438/22; 438/37; 438/978
(58) Field of Search ............................. 438/22, 37, 60, 438/752, 936, 978; 257/79, 101, 103, 190, 183, 201, 613, 618, 622, 623

(56) References Cited

U.S. PATENT DOCUMENTS

| 4,855,249 A | 8/1989 | Akasaki et al. ............... 437/81 |
| 5,122,845 A | 6/1992 | Manabe et al. ............... 357/17 |
| 5,146,465 A | 9/1992 | Khan et al. .................... 372/45 |
| 5,369,289 A | 11/1994 | Tamaki et al. ................ 257/99 |
| 5,679,152 A | 10/1997 | Tischler et al. .............. 117/97 |
| 5,862,167 A | 1/1999 | Sassa et al. ................... 372/45 |
| 5,874,747 A | 2/1999 | Redwing et al. ............ 257/103 |
| 5,953,581 A * | 9/1999 | Yamasaki et al. ............ 438/22 |
| 6,045,626 A | 4/2000 | Yano et al. ................. 117/950 |
| 6,091,083 A | 7/2000 | Hata et al. ................... 257/190 |
| 6,172,382 B1 | 1/2001 | Nagahama et al. ......... 257/103 |

FOREIGN PATENT DOCUMENTS

JP          2000-323753          11/2000

* cited by examiner

*Primary Examiner*—David Nelms
*Assistant Examiner*—Long Tran
(74) *Attorney, Agent, or Firm*—McGinn & Gibb, PLLC

(57) ABSTRACT

A method of manufacturing a group III nitride compound semiconductor device, includes providing a substrate, forming a group III nitride compound semiconductor layer having a device function, and forming an undercoat layer between the substrate and the group III nitride semiconductor layer, the undercoat layer having a surface of a peak and trough structure.

74 Claims, 11 Drawing Sheets

METHOD FOR MANUFACTURING GROUP III NITRIDE COMPOUND SEMICONDUCTOR DEVICE

This application is a Continuation of U.S. application Ser. No. 09/888,519 filed Jun. 26, 2001, which is a Continuation-in-part of application Ser. No. 09/658,586 filed on Sep. 8, 2000, now abandoned, which are incorporated herein by reference.

This is a Continuation-in-part of application Ser. No. 09/658,586, filed on Sep. 8, 2000, which is incorporated herein by reference.

BACKGROUND OF THE INVENTION

1. Field of the Invention

The present invention relates to a group III nitride compound semiconductor device.

The present application is based on Japanese Patent Applications No. Hei. 11-276556, 2000-41222, 2000-191779 which are incorporated herein by reference.

2. Description of the Related Art

A group III nitride compound semiconductor device is used in a light-emitting device such as a light-emitting diode, etc. Such a light-emitting device has a configuration in which a group III nitride compound semiconductor layer having a device function is epitaxially grown on a surface of a substrate, for example, formed of sapphire.

The internal stress is, however, generated between the sapphire substrate and the group III nitride semiconductor layer because the sapphire substrate is different in thermal expansion coefficient and lattice constant from the group III nitride compound semiconductor layer. As a phenomenon caused by the internal stress, a bowing occurs in a growth of the group III nitride compound semiconductor on the sapphire substrate. If the bowing becomes too large, the crystallinity of semiconductor not only may be spoiled, but that the semiconductor layer may also has many cracks had inconvenience occurs in alignment of photolithography at the time of production of the device.

In the background art, therefore, a so-called low-temperature buffer layer was formed between the substrate and the group III nitride compound semiconductor layer to thereby relax the internal stress.

The growth temperature of the group III nitride compound semiconductor layer for forming a device by a general metal organic chemical vapor deposition method (hereinafter referred to as "MOCVD" method) is 1000° C. or higher. On the other hand, the growth temperature of the low-temperature internal stress layer is approximately in a range of from 400 to 500° C. Hence, the temperature history of from the step of cleaning the substrate at about 1000° C. to the growth of the group III nitride compound semiconductor layer is high temperature (1000° C.)→low temperature are (400 to 500° C.)→high temperature (1000° C.). Hence, not only was, it difficult to control the temperature but also thermal efficiency was poor.

It may be, therefore, conceived that the buffer layer is formed at a high temperature. The problem of bowing, however, occurs again if a group III nitride compound semiconductor (for example, an AlN layer the same as the low-temperature buffer layer) is grown directly on the substrate at a high temperature of about 1000° C.

SUMMARY OF THE INVENTION

The inventors of the present invention have made investigation over and over again to solve the problem of bowing. As a result, the inventors thought up the present invention as follows:

A group III nitride compound semiconductor device comprises an undercoat layer having surface on which a group III nitride compound semiconductor layer having a device function can be formed, the surface of the undercoat layer containing inclined faces, wherein the projected area ratio of the inclined faces to the whole surface of the undercoat layer on a plane of projection is in a range of from 5 to 100%.

According to another aspect, preferably, the undercoat layer containing inclined faces is formed as a texture structure. Here, the "texture structure" means a structure in which the surface of the undercoat layer is shaped like teeth of a saw in any sectional view, that is, a combination of a peak and a trough is repeated through an inclined face. The peaks may include those which are independent of each other as polygonal pyramids (inclusive of cones) or those which are standing in a row like a mountain range.

In this specification, a "sectional trapezoid shape" means a shape in which there is a flat region at the top of each peak, and a shape in which the flat region is wider is referred to as a "pit shape".

In this specification, when the projected area ratio occupied by the inclined face region on a whole plane of projection is in a range of from 70to 100%, the shape is referred to as a "texture structure"; when the projected area ratio is in a range of from 30 to 70%, the shape is referred to as a "sectional trapezoid shape"; and when the projected area ratio is in a range of from 5 to 30%, the shape is referred to as a "pit shape".

Use of the aforementioned undercoat layer relaxes internal stress between the group III nitride compound semiconductor layer and the substrate including the undercoat layer. It is supposed that internal stress applied to a hetero interface is relaxed by acting in directions parallel to the inclined faces because of the presence of the inclined faces in the hetero interface. If internal stress is relaxed in the aforementioned manner, the problem of bowing is reduced. As a result, not only can the group III nitride compound semiconductor layer be prevented from cracking, but also the crystallinity of the group III nitride compound semiconductor layer can be improved. Moreover, it becomes easy to perform alignment of photolithography at the time of production of the device.

Hereupon, the undercoat layer transmits light having a wavelength of not smaller than 360 nm because the undercoat layer is made of a group III nitride compound semiconductor. Incidentally, when the undercoat layer is made of AlN (refractive index: 2.12) and the group III nitride compound semiconductor layer provided on the undercoat layer is made of GaN (refractive index: 2.60), the angle of incidence of light on the undercoat layer must be selected to be not larger than about 22 degrees so that light given from the GaN side is totally reflected on the undercoat layer. In the case of an undercoat layer having the aforementioned texture structure, it is impossible to obtain total reflection surely on the whole surface of the undercoat layer though it maybe said that the reflectivity of the undercoat layer is relatively high because the angle of incidence of light on the surface of the undercoat layer becomes small.

From the above point of view, the present invention may be configured as follows.

A group III nitride compound semiconductor device comprises: a substrate; a group III nitride compound semiconductor layer having a function light-emitting device or a function or a photodetecor light-receiving device function; an undercoat layer formed between the substrate and the group II nitride compound semiconductor layer and made of a group III nitride compound semiconductor, the undercoat layer having a surface formed as a texture structure or shaped like trapezoids in section, or like pits; and a reflection layer formed on the surface of the undercoat layer and made of nitride of at least one kind of metal selected from the group consisting of titanium, zirconium, hafnium and tantalum, the reflection layer having a surface shape formed in accordance with the surface shape of the undercoat layer.

According to the group III nitride compound semiconductor device configured as described above, a reflection layer made of predetermined metal nitride is formed on the surface of the undercoat layer having a surface shape such as a texture structure, a trapezoid shape in section or a pit shape. The reflection layer also has such a surface shape as a texture structure, a trapezoid shape in section or a pit shape because the reflection layer is formed in accordance with the surface shape of the undercoat layer.

The reflection layer made of metal nitride has a so-called metallic-color mirror surface. Moreover, the angle of incidence of light on the surface of the texture structure, trapezoid shape in section or pit shape from the group III nitride compound semiconductor layer can be made smaller. Hence, the reflection layer according to the present invention can substantially totally reflect light incident on the reflection layer from the group III nitride compound semiconductor layer side.

The inventors of the present invention have already proposed nitride of at least one metal selected from the group consisting of titanium, zirconium, hafnium and tantalum so that a group III nitride compound semiconductor can be grown with good crystallinity on the metal nitride when the metal nitride is used as the aforementioned predetermined metal nitride (see Japanese Patent Publication No. Hei. 2000-323753). Also in the case where a group III nitride compound semiconductor is to be grown on a reflection layer made of the aforementioned metal nitride, internal stress between the group III nitride compound semiconductor layer and the substrate inclusive of the reflection layer and the undercoat layer can be relaxed because the surface of the reflection layer is formed as a texture structure, a trapezoid shape in section or a pit shape. As similar to the aforementioned, it is conceived that stress applied on a hetero interface is diffused in parallel to the inclined faces because of the presence of the inclined faces in the hetero interface and, accordingly, the stress can be relaxed. When internal stress is relaxed in the aforementioned manner, the bowing problem or cracking is reduced. Moreover, the crystallinity of the group III nitride compound semiconductor later is improved, and the group III nitride compound semiconductor layer can be aligned easily when the device is produced.

Features and advantages of the invention will be evident from the following detailed description of the preferred embodiments described in conjunction with the attached drawings.

BRIEF DESCRIPTION OF THE DRAWINGS

The file of this patent contains at least one drawing executed in color. Copies of this patent with color drawings will be provided by the Patent and Trademark Office upon request and payment of the necessary fee.

DETAILED DESCRIPTION OF THE PREFERRED EMBODIMENTS

Figure 1:
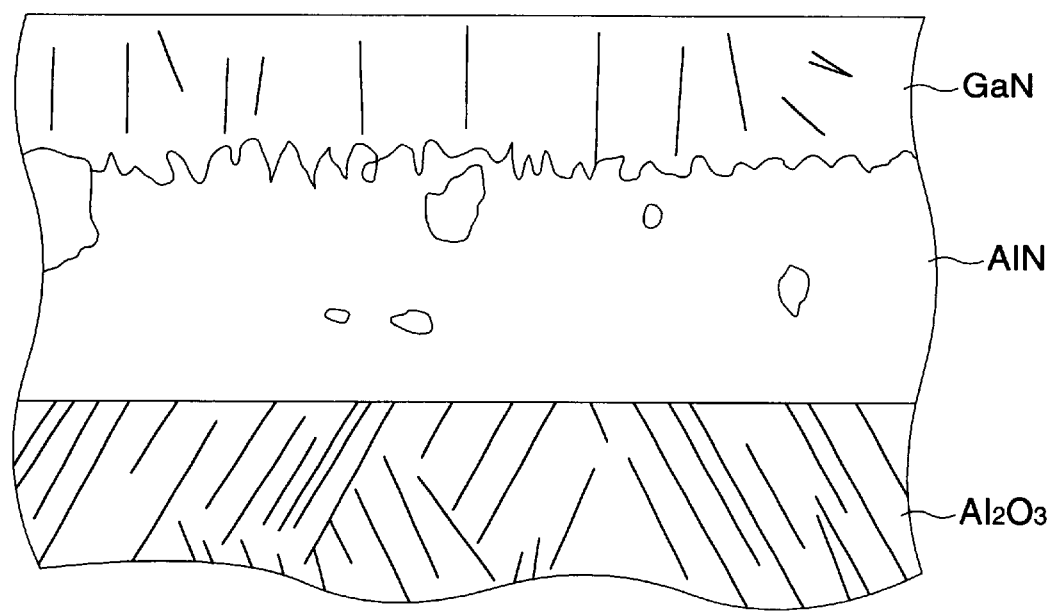
FIG. 1 is a sectional view showing an undercoat layer of a texture structure.

Respective constituent parts of the present invention will be described below in detail.

Substrate

The material of the substrate is not particularly limited so long as an undercoat layer made of a group III nitride compound semiconductor can se formed on the substrate. Examples of the substrate material which can be used include: hexagonal-crystal such as sapphire, SiC (silicon carbide), GaN (gallium nitride), etc.; and cubic-crystal such as Si (silicon), GaP (gallium phosphide), GaAs (gallium arsenide), etc.

Group III Nitride Compound Semiconductor Layer

A group III nitride compound semiconductor is represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, so-called ternary compounds such as $Al_XGa_{1-X}N$, $Al_XIn_{1-X}N$ and $Ga_XIn_{1-X}N$ ($0<x<1$ in the above), and so-called quaternary compounds such as $Al_XGa_YIn_{1-X-Y}N$ ($0<X<1$, $0<Y<1$, $0<X+Y<1$). The group III elements may be partially replaced by boron (B), thallium (Tl), etc. The nitrogen (N) may be partially replaced by phosphorus (P), arsenic (As), antimony (Sb), bismuth (Bi), etc.

The group III nitride compound semiconductor may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities to reduce the resistance, the group III nitride compound semiconductor may be subjected to electron beam irradiation, plasma irradiation or heating by means of a furnace.

The group III nitride compound semiconductor may be formed by a metal organic chemical vapor deposition method (MOCVD method) or any other known method such as a molecular beam epitaxy method (MBE method), a halide vapor phase epitaxy method (HVPE method), a sputtering method, an ion-plating method, or the like.

Examples of the device formed from the group III nitride compound semiconductor include optical devices such as a light-emitting diode, a photodetector, a laser diode, a solar cell, ect.; bipolar devices such as a rectifier, a thyristor, a transistor, etc.; unipolar devices such as an EET, etc.; and electronic devices such as a microwave device, etc.

Incidentally, a homo structure, a single hetero structure or a double hetero structure with an MIS junction, a PIN junction or a p-n junction may be used as the configuration of the light-emitting device or the photodetector. A quantum well structure (a single or multiple quantum well structure) may be used as the light-emitting layer and/or the clad.

The undercoat layer is not specifically limited if the aforementioned group III nitride compound semiconductor can be grown on the undercoat layer.

In an embodiment, the undercoat layer is constituted by a first group III nitride compound semiconductor layer formed on a substrate.

Examples of the first group III nitride compound semiconductor formed on the substrate include quaternary compound semiconductors represented by $Al_xGa_yIn_{1-X-Y}N$ (0<X<1, 0<Y<1, 0<X+Y<1), ternary compound semiconductors represented by $Al_xGa_{1-x}N$ (0<X<1), and binary compound semiconductors by AlN, GaN and InN. Especially, AlN is preferably used on a sapphire substrate.

Each of these first group III nitride compound semiconductor layers substantially has a single crystal structure.

The inclined faces are formed in the surface of the undercoat layer. A base structure forming the inclined faces may include polygonal pyramids such as triangular pyramids, quadrilateral pyramids, etc., or structures like a mountain range in which peaks and troughs are connected alternately by belt-like inclined faces. The inclined faces are formed on the whole surface of the undercoat layer. Each of the inclined faces is so small as to have a width smaller than 2 $\mu$m on a plane of projection. The projected area ratio of the inclined faces to the surface of the undercoat layer on a plane of projection is set to be preferably in a range of from 5 to 100%, more preferably in a range of from 30 to 100%, further preferably in a range of from 70 to 100%.

Figure 2:
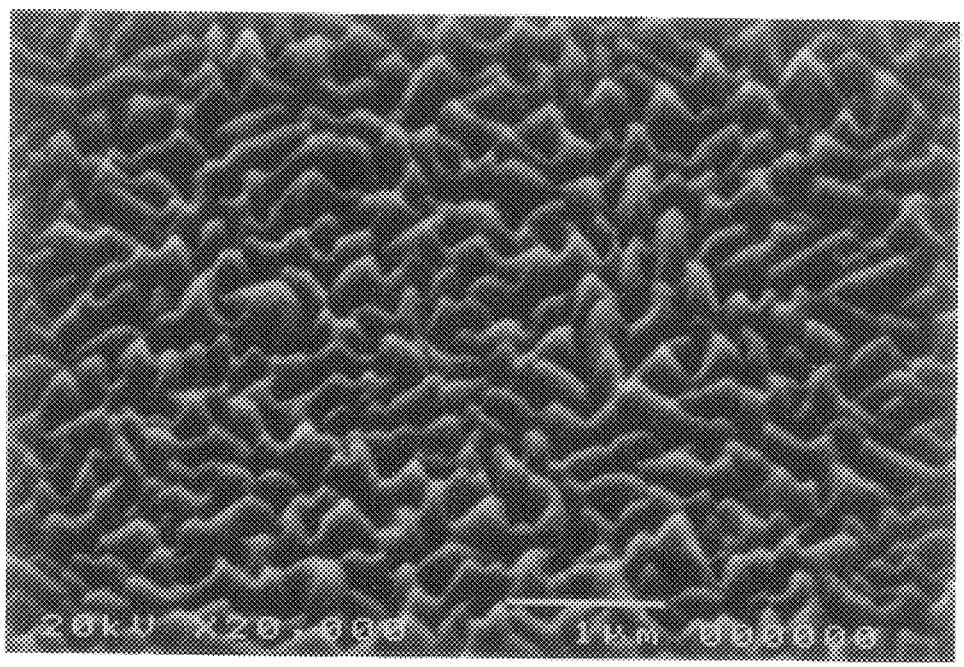
FIG. 2 is a surface SEM photograph showing an undercoat layer of a texture structure.

If the projected area ratio of the inclined faces on a whole plane of projection is in a range of from 70 to 100%, the surface of the undercoat layer exhibits a texture structure as shown in FIGS. 1 and 2 and is shaped like mountains in section. If the projected area ratio is 100%, the surface of the undercoat layer exhibits a structure in which a combination of a peak and a trough is repeated like teeth of a saw.

Figure 3:
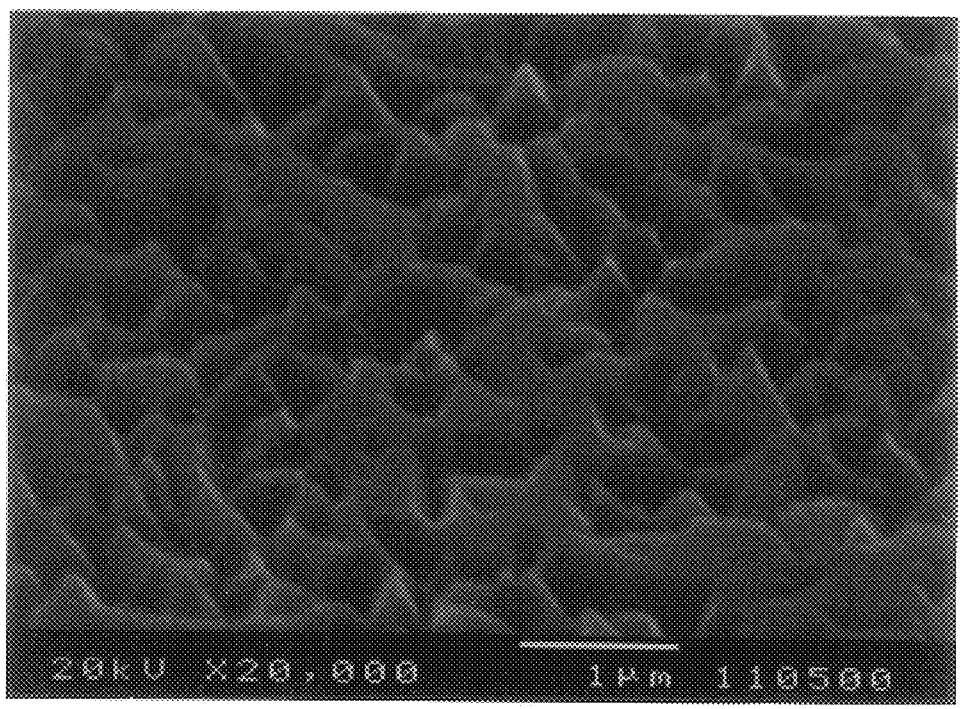
FIG. 3 is a surface SEM photograph showing an undercoat layer of a sectional trapezoid shape.

If the projected area ratio of the inclined faces on a whole plane of projection is in a range of from 30 to 70%, the surface of the undercoat layer is shaped like trapezoids in section so that insular portions and mountain portions coexist as shown in FIG. 3.

Figure 4:
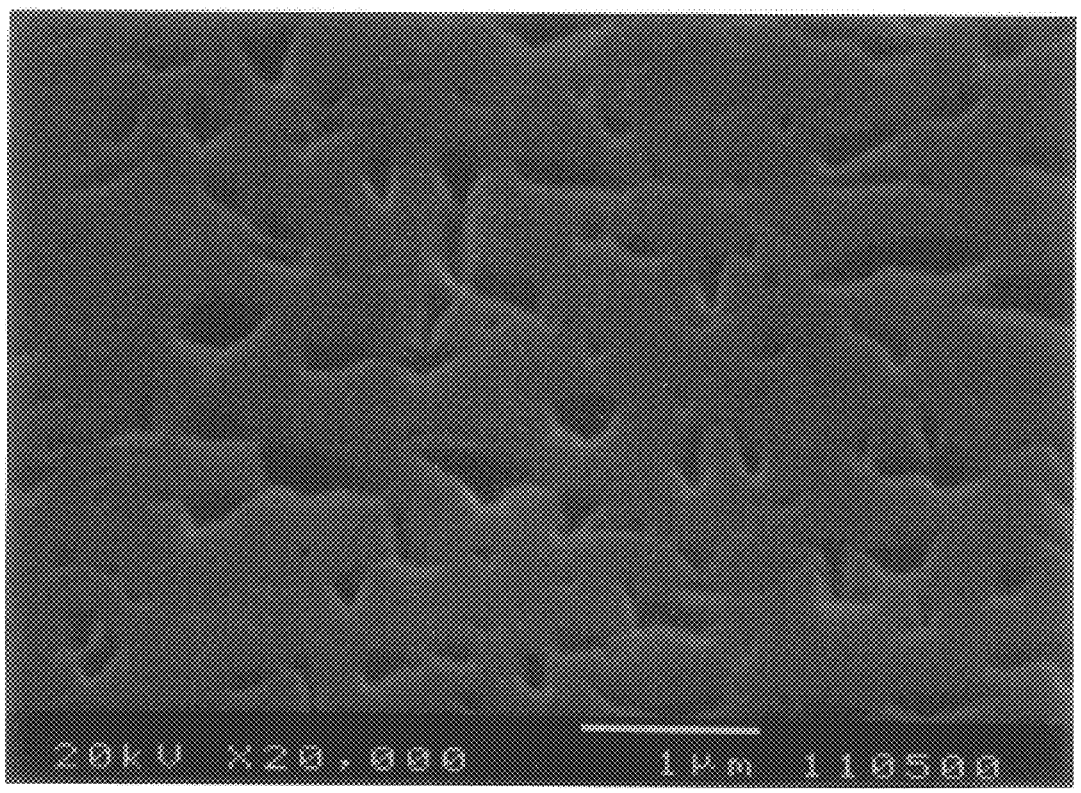
FIG. 4 is a surface SEM photograph showing an undercoat layer of a pit shape.

If the projected area ratio of the inclined faces on a plane of projection is in a range of from 5 to 30%, the surface of the undercoat layer is shaped like pits so that holes are formed in a flat surface as shown in FIG. 4.

Here, the "plane of projection" means a plane of projection obtained by performing parallel projection of the surface of the undercoat layer onto a plane parallel with the substrate.

The first group III nitride compound semiconductor layer having a rough surface as described above is formed by pouring a larger amount of ammonia gas ($NH_3$) than the general growth condition and at a high temperature (about 1,150° C.) which is substantially the same temperature as a second group III nitride compound semiconductor having a device function will be formed.

Next, an experimentation for confirming the effect of the present invention will be described below.

Figure 5:
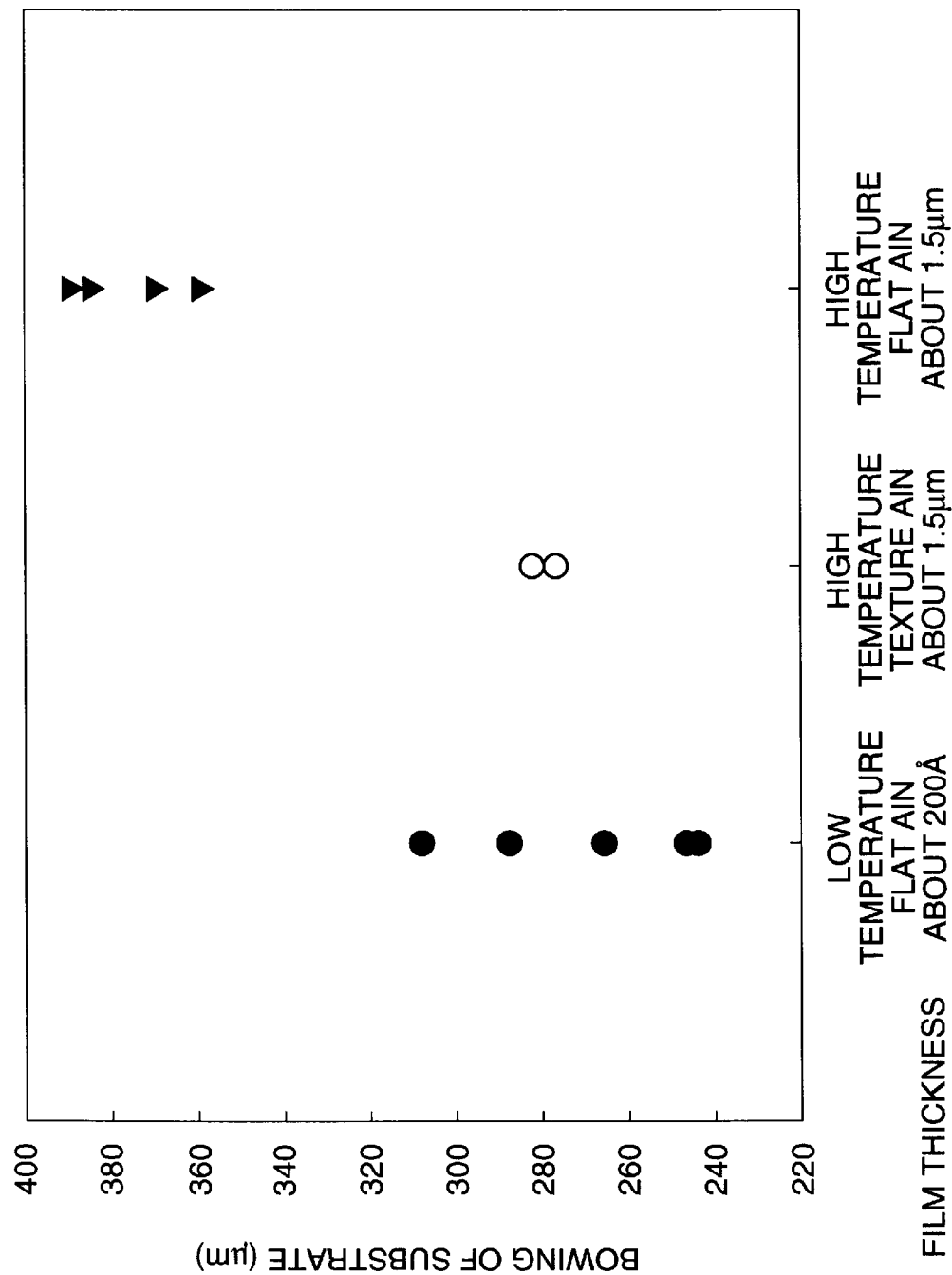
FIG. 5 is a graph showing the quantity of bowing of a substrate.
Figure 6:
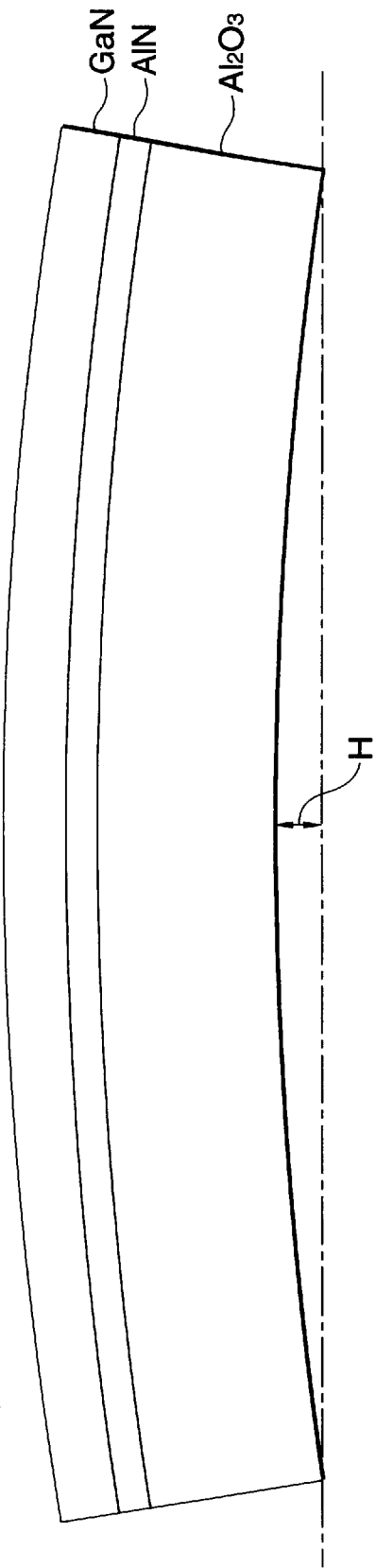
FIG. 6 is a sectional view showing bowing of a substrate.

An AlN layer was formed on a sapphire substrate by the MOCVD method for a reference sample. A 4 $\mu$m thick GaN layer was further formed on the AlN layer by the MOCVD method. The quantity of bowing of each sample at room temperature was as shown in FIG. 5. As shown in FIG. 6, the quantity of bowing was measured as the center height H of each sample. In FIG. 5, the symbol ● indicates a result in the case where the growth temperature and thickness of the AlN layer were 400° C. and 200 Å respectively. The symbol ▼ indicates a result in the case where the growth temperature and thickness of the AlN layer as a layer having a flat surface were 1,130° C. and 1.5 $\mu$m respectively. It was apparent from FIG. 5 that a large quantity of bowing occurred in the laminate when the AlN layer had a flat surface.

On the other hand, the reference symbol ○ shows the embodiment of the present invention. In this case, the AlN layer had a surface of a texture structure as shown in FIGS. 1 and 2 and the growth temperature and thickness of the AlN layer were 1,130° C. and 1.5 $\mu$m respectively. It was apparent from the result of FIG. 5 that a small quantity of bowing equivalent to that of the background-art low-temperature buffer layer (●) is shown when the AlN layer had such a texture structure. Moreover, variation in bowing became small.

Moreover, the full width at half-maximum (FWHM) of a rocking curve of the GaN layer formed on the AlN layer having such a surface texture structure was 16 seconds. This value was approximately equal to that of an n-type GaN contact layer used in an existing light-emitting device. Hence, this value exhibited sufficient crystallinity to serve as a group III nitride compound semiconductor layer having a device function.

Alternatively, after an undercoat layer having a flat surface is grown, the flat surface may be treated by a method such as etching, etc., to thereby shape the surface of the undercoat layer into a texture structure, or like a sectional trapezoid shape or like a pit shape.

Preferably, a sedimentary layer may be formed between the substrate and the undercoat layer.

When the undercoat layer is formed of a group III nitride compound semiconductor, the sedimentary layer may be preferably formed also of a group III nitride compound semiconductor or of a metal nitride compound semiconductor. Among the group III nitride compound semiconductors, preferably $Al_xGa_{1-x}N$ (0≦X≦1), more preferably AlN may be used as the sedimentary layer. Among the metal nitride compound semiconductors, preferably one kind or a combination of two or more kinds selected from the group of titanium nitride, hafnium nitride, zirconium nitride and tantalum nitride, more preferably titanium nitride may be used as the sedimentary layer. In this case, the substrate is preferably formed of sapphire. More preferably, the sedimentary layer is formed on face a of the sapphire substrate.

A known method (such as an MOCVD method, a sputtering method, or the like) for forming a group III nitride compound semiconductor or a metal nitride compound semiconductor can be used as a method for forming the aforementioned sedimentary layer.

The thickness of the sedimentary layer is not particularly limited but is set to be in a range of from several nm to hundreds nm (from tens Å to thousands Å).

According to the inventors' investigation, the interposition of the sedimentary layer between the substrate and the undercoat layer (distortion relaxing layer) makes the inclination in the surface of the undercoat layer easy to control. That is, the condition for forming a surface of a desired structure (such as a texture structure, a sectional trapezoid shape or a pit structure) is widened so that the surface of the desired structure is formed easily. Hence, a device having such an undercoat layer can be produced with good yield.

The sedimentary layer can be provided as a laminate of two or more layers as follows.

An intermediate layer of a group III nitride compound semiconductor, preferably AlN or GaN, is formed on a first sedimentary layer which is formed on the substrate. A second sedimentary layer is formed on the intermediate layer (this operation may be repeated). The undercoat layer is formed on the second sedimentary layer.

The composition of the first sedimentary layer may be the same as or different from that of the second sedimentary layer.

Also the thickness of the intermediate layer is not particularly limited.

Reference is made to Japanese Patent Publications No. Hei.7-267796 and 9-199759 as examples in which a plurality of sedimentary layers are formed.

Further, a reflection layer made of nitride may be formed on the surface of the undercoat layer.

As the material for forming the reflection layer, at least one member may be selected from the group consisting of titanium nitride, hafnium nitride, zirconium nitride and tantalum nitride. Especially, titanium nitride is preferably used. The method for growing the metal nitride is not particularly limited but examples of the available method include: CVD (Chemical Vapor Deposition) such as plasma CVD, thermal CVD, optical CVD, or the like; PVD (Physical Vapor Deposition) such as sputtering, reactive sputtering, laser ablation, ion plating, evaporation, or the like; and so on.

The thickness of the reflection layer is preferably selected to be in a range of from 0.1 to 5.0 $\mu$m. If the thickness of the reflection layer is larger than the upper limit, there is a risk that the roughness of the surface of the undercoat layer is lost so that the surface of the reflection layer is flattened. As a result, it becomes impossible to expect relaxation of stress on the hetero interface between the reflection surface and the group III nitride compound semiconductor layer. If the thickness is smaller than the lower limit, reflection of light becomes insufficient. Especially, the thickness of the reflection layer is preferably selected to be in a range of from 0.1 to 1.0 $\mu$m. More especially, the thickness of the reflection layer is preferably selected to be in a range of from 0.2 to 0.5 $\mu$m.

The embodiment has been described above on the assumption that a group III nitride compound semiconductor layer is grown on an undercoat layer and a reflection layer having inclined faces so that the group III nitride compound semiconductor layer serves directly as a device function layer. Incidentally, the group III nitride compound semiconductor layer may be used as an intermediate layer so that a second undercoat layer having inclined faces for relaxing distortion can be formed on the intermediate layer (this operation may be further repeated). Hence, the internal stress of the group III nitride compound semiconductor layer having a device function is further relaxed to thereby improve the crystallinity thereof.

The intermediate layer may have a surface containing inclined faces (of a texture structure, or the like) reflecting the surface structure of the undercoat layer or may have a flat surface.

The reflection layer is formed on the undercoat layer located in the uppermost position.

Embodiments of the present invention will be described below.

Figure 7:
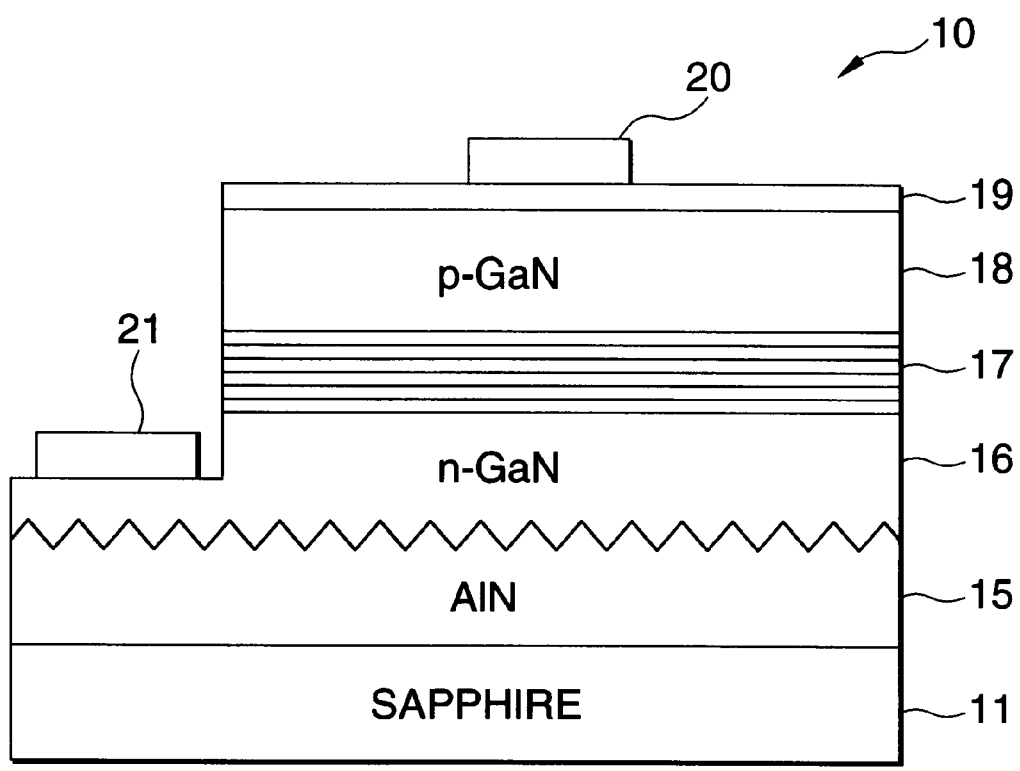
FIG. 7 shows a light-emitting diode according to an embodiment of the present invention.

FIG. 7 shows the configuration of a light-emitting diode 10 according to an embodiment of the present invention.

Specifications of respective layers are as follows.

| Layer | Composition | Dopant | (Thickness) |
|---|---|---|---|
| Transparent electrode 19 | | | |
| p-type layer 18 | p-GaN | Mg | (0.3 $\mu$m) |
| Layer 17 | | | |
| Quantum well layer | In$_{0.15}$Ga$_{0.85}$N | | (3.5 nm) |
| Barrier layer | GaN | | (3.5 nm) |
| n-type layer 16 | n-GaN | Si | (4 $\mu$m) |
| Undercoat layer 35 | AlN | | (0.2 $\mu$m) |
| Sedimentary layer 31 | AlN | | (15 $\mu$m) |
| Substrate 11 | Sapphire (face a) | | (350 $\mu$m) |

The number of repetition of quantum well and barrier layers: 1 to 10

The n-type layer 16 may be made to have a double-layered structure with an n$^-$ layer of low electron density on the light-emitting layer 17 side and an n$^+$ layer of high electron density on the undercoat layer 15 side.

The layer 17 is not limited to the superlattice structure. A single hetero structure, a double hetero structure, a homojunction structure, or the like, may be used as the configuration of the light-emitting device.

A group III nitride compound semiconductor layer which is doped with an acceptor such as magnesium and which has a wide band gap may be interposed between the layer 17 and the p-type layer 18. This is aimed at prevention of electrons imported in the light-emitting layer 17, from diffusing into the p-type layer 18.

The p-type layer 18 may be made to have a double-layered structure with a p$^-$ layer of low hole density on the light-emitting layer 17 side and a p$^-$ layer of high hole density on the electrode side. Each of the quantum well layers may be formed of InGaAlN, including InN, GaN, InGaN and InAlN. Each of the barrier layers may be formed of InGaAlN, including GaN, InGaN, InAlN and AlGaN, having a wider energy gap than that of the quantum well layer.

The light-emitting diode having such a configuration as described above is produced as follows.

First, while a hydrogen gas (H$_2$) is circulated into a reactor of an MOCVD apparatus, the sapphire substrate is heated to 1,300° C. to thereby clean the surface thereof.

Then, trimethylaluminum (TMA) and NH$_3$ are imported into the reactor at the same substrate temperature so that an undercoat layer 15 of AlN is grown by an MOCVD method. When the AlN undercoat layer 15 is grown to a predetermined thickness while TMA and NH$_3$ are imported in the condition of 30 $\mu$mol/min and 3 SLM respectively on this occasion, the surface of the AlN undercoat layer 15 has a texture structure as shown in FIGS. 1 and 2.

Similarly, if the flow rate of NH$_3$ in the aforementioned condition is reduced to a value in a range of from ½ times to ⅓ times, the surface of the undercoat layer 15 has a sectional trapezoid structure as shown in FIG. 3.

Similarly, if the flow rate of NH$_3$ in the aforementioned condition is reduced to a value in a range of from ¼ times to ⅕ times, surface of the undercoat layer 15 has a pit structure as shown in FIG. 4.

In the condition for forming a flat AlN film on the sapphire substrate, if the growth rate of AlN in a direction of a c axis (that is, in a direction perpendicular to the substrate) is compared with the growth rate of AlN in a direction perpendicular to the c axis (that is, in a direction parallel to the substrate) especially in an initial stage of formation of the AlN film, the latter speed is sufficiently larger. Hence, AlN is two-dimensionally grown in the direction parallel to the substrate and then three-dimensionally grown in the direction perpendicular to the substrate. That is, there is a time long enough to form a uniform growth site by migration of Al atoms and N atoms into the surface of growth.

If the amount of N atoms on the growth surface is increased against this condition, the growth rate of AlN in the direction perpendicular to the substrate becomes higher because Al atoms are particularly bonded to N atoms in the surface of growth before appropriate migration of the Al atoms. As a result, growth in the direction parallel to the substrate becomes so ununiform that a texture structure can be produced. It may be safely said that an intermediate course of formation of the texture structure is a sectional trapezoid structure or a pit structure.

Incidentally, if the amount of N atoms is increased more greatly, AlN, is grown not as a single crystal but as grains.

Then, while the substrate temperature is kept, an n-type layer 16 is formed and second group III nitride compound semiconductor layers 17 and 18 after the n-type layer 16 are formed by an ordinary method (MOCVD method). In the growth method, an $NH_3$ and group III element alkyl compound gases such as trimethylgallium (TMG), trimethylaluminum (TMA) and trimethylindium (TMI) are supplied onto a substrate heated to a suitable temperature and are subjected to a thermal decomposition reaction to thereby make a desired crystal grow on the substrate.

Then, the p-type layer 18, the layer 17 and the n-type layer 16 are partially removed by reactive ion etching with Ti/Ni as a mask. Thus, a portion of the n-type layer 16 on which an n-type electrode pad 21 will be formed is exposed.

A photo resist is applied onto the semiconductor surface uniformly. The photo resist of the electrode-forming portion on the p-type layer 18 is removed by photolithography. Thus, the p-type layer 18 of this portion is exposed. An Au—Co transparent electrode layer 19 is formed on the exposed portion or the p-type layer 18.

Then, a p-type electrode pad 20 and an n-type electrode pad 21 are formed by vapor deposition in the same manner as described above.

Figure 8:
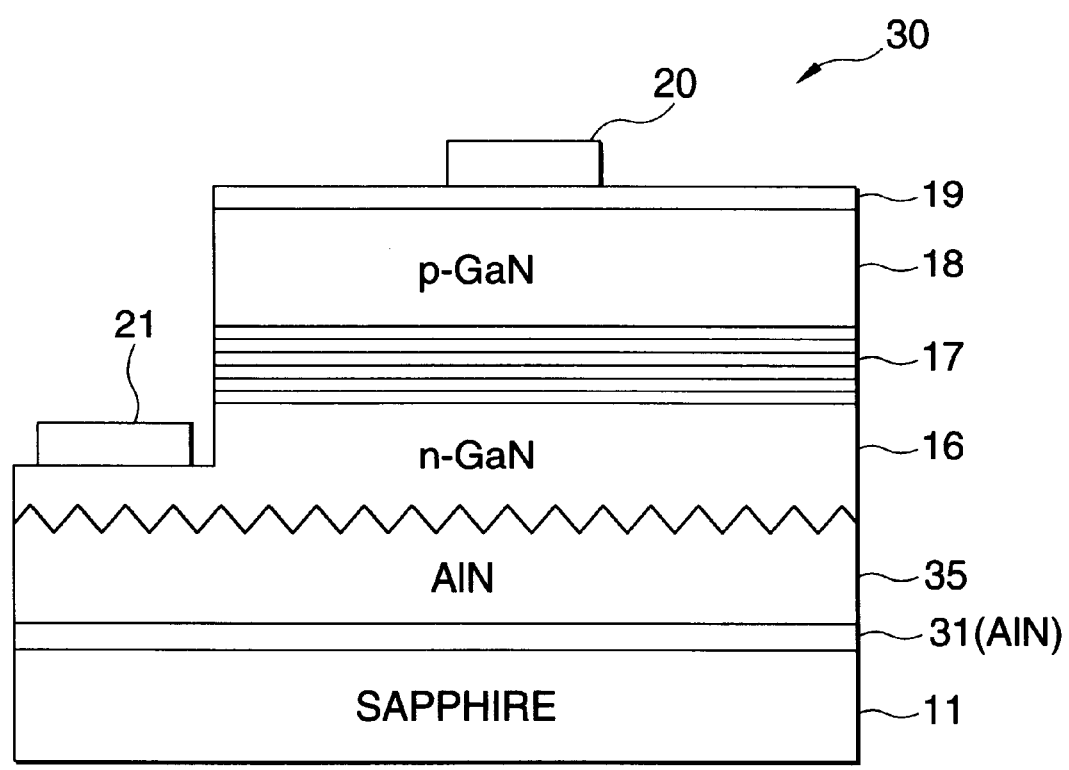
FIG. 8 shows a light-emitting diode according to another embodiment of the present invention.

FIG. 8 shows a light-emitting diode 30 according to another embodiment of the present invention. Same parts in FIGS. 7 and 8 are referenced correspondingly. The description thereof will be therefore omitted.

In the light-emitting diode 30 according to this embodiment, a sedimentary layer 31 of AlN is interposed between the sapphire substrate 11 and the undercoat layer 35.

Specifications of respective layers are as follows.

| Layer | Composition | Dopant | (Thickness) |
| --- | --- | --- | --- |
| Transparent electrode 19 | | | |
| p-type layer 18 | p-GaN | Mg | (0.3 µm) |
| Layer 17 | | | |
| Quantum well layer | $In_{0.15}Ga_{0.85}N$ | | (35 Å) |
| Barrier layer | GaN | | (35 Å) |
| n-type layer 16 | n-GaN | Si | (4 µm) |
| Undercoat layer 15 | AlN | | (1.5 µm) |
| Substrate 11 | Sapphire (face a) | | (350 µm) |

The number of repetition of quantum well and barrier layers: 1 to 10

The light-emitting diode 30 having the above configuration is produced as follows.

First, reactive sputtering of an aluminum target is performed on a sapphire substrate at a temperature of from 300 to 500° C. by an argon gas sputtering apparatus while a nitrogen gas is imported. The sapphire substrate having AlN deposited thereon in the aforementioned manner is set into an MOCVD apparatus. While $H_2$ and $NH_3$ are imported, the substrate is heated to 1,130° C.

Figure 9:
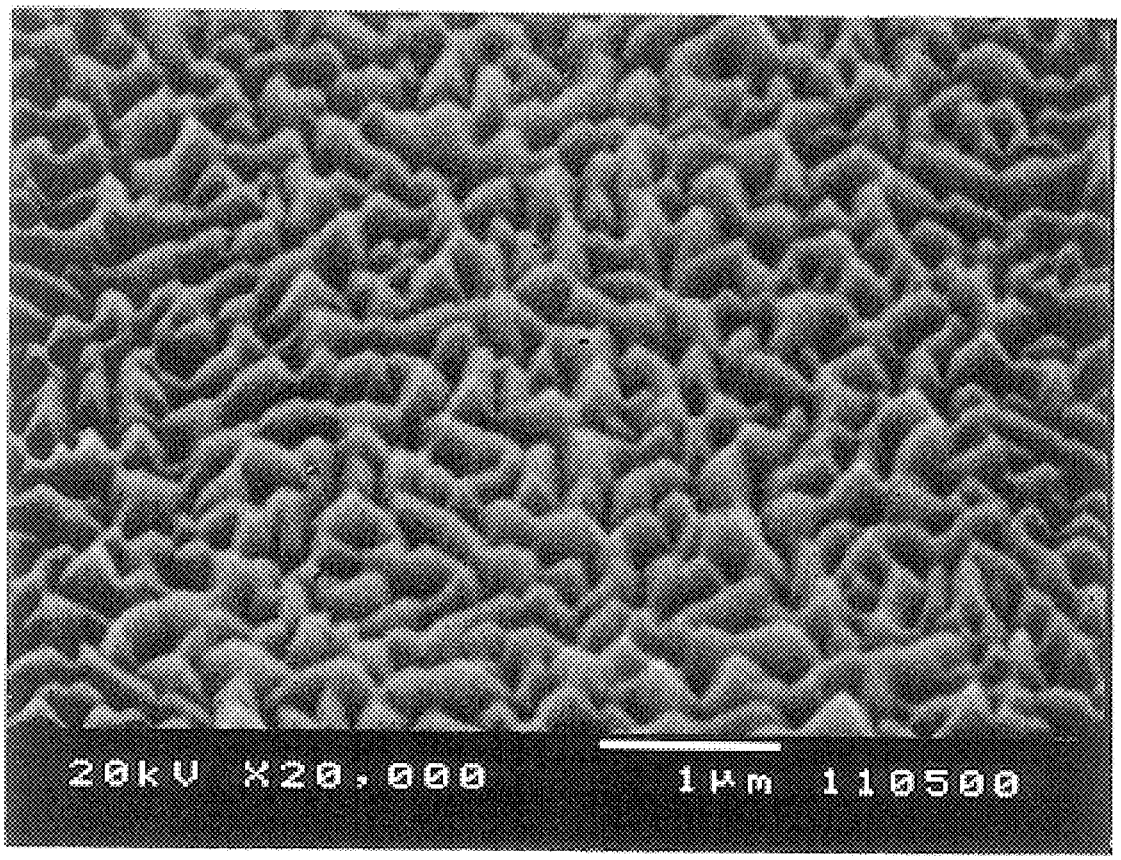
FIG. 9 is a surface SEM photograph of an undercoat layer according to the embodiment shown in FIG. 8.

Then, TMA and $NH_3$ are imported in the condition of 30 µmol/min and 3 SLM respectively to thereby form an AlN undercoat layer 35. The surface of the undercoat layer 35 has a texture structure as shown in FIG. 9 which is a SEM photograph thereof.

The same method as shown in FIG. 7 is used as a method for forming an n-type layer 16 and layers after the n-type layer 16.

Figure 10:
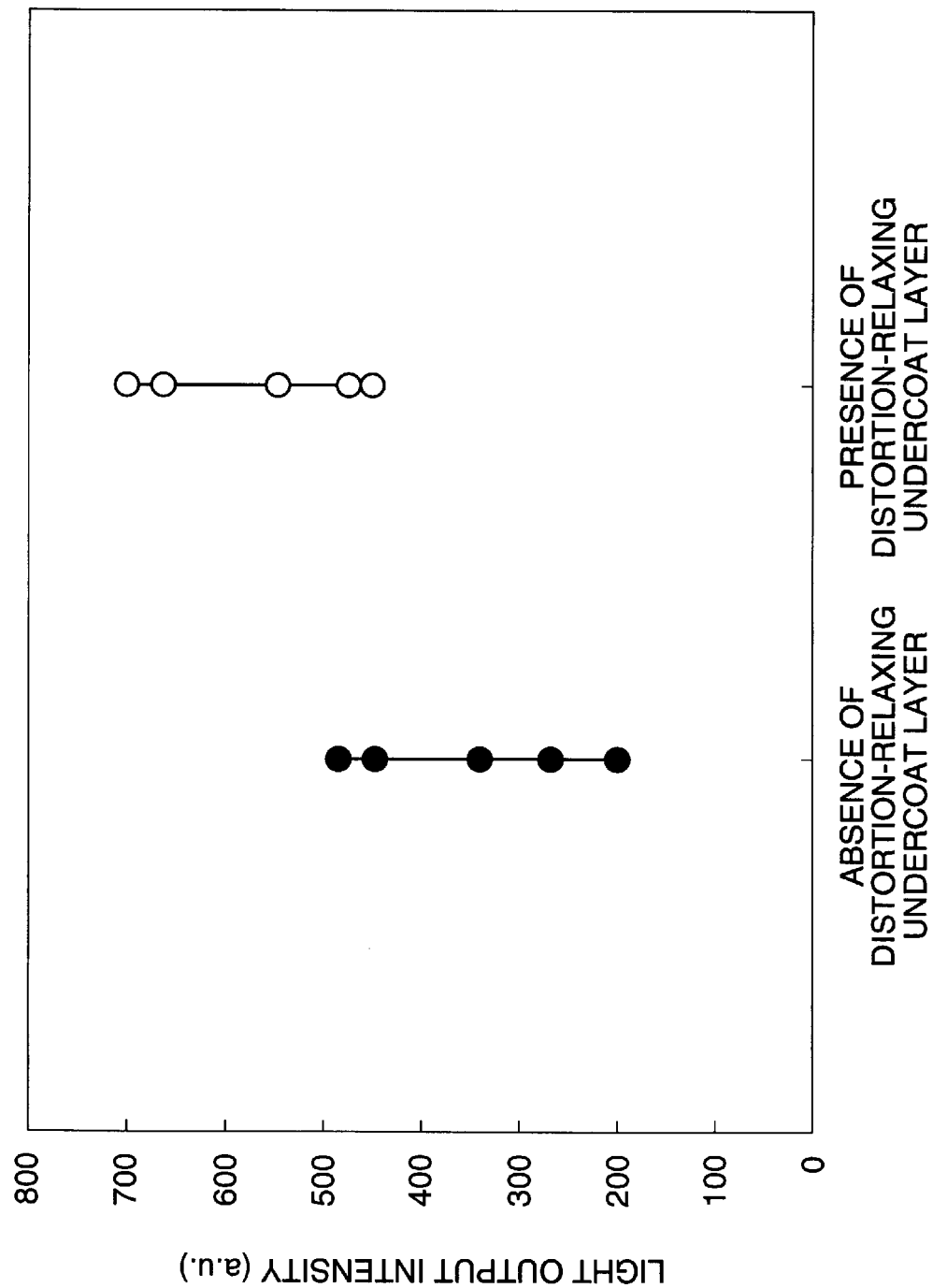
FIG. 10 is a graph for comparison between the light output intensity of the light-emitting diode as the embodiment shown in FIG. 8 and the light output of a light-emitting diode as a comparative example.

The light output of the light-emitting diode 30 formed according to this embodiment, and the light output of a light-emitting diode (known configuration) according to a comparative example in which the distortion-relaxing undercoat layer 35 is omitted from the former configuration are measured by a photo detector and compared with each other (FIG. 10). In FIG. 10, the reference symbol ○ shows the light output of the light-emitting diode 30 according to the embodiment, and the reference symbol ● shows the light output of the light-emitting diode according to the comparative example. It is apparent from FIG. 10 that the light-emitting diode 30 of the embodiment achieves a higher light output than that of the comparative example. It is supposed that distortion in the n-type layer 16, the light-emitting layer 17 and the p-type layer 18 which constitute a device structure is relaxed due to the presence of the undercoat layer 35 to result in improvement of crystallinity of each layer.

Figure 11:
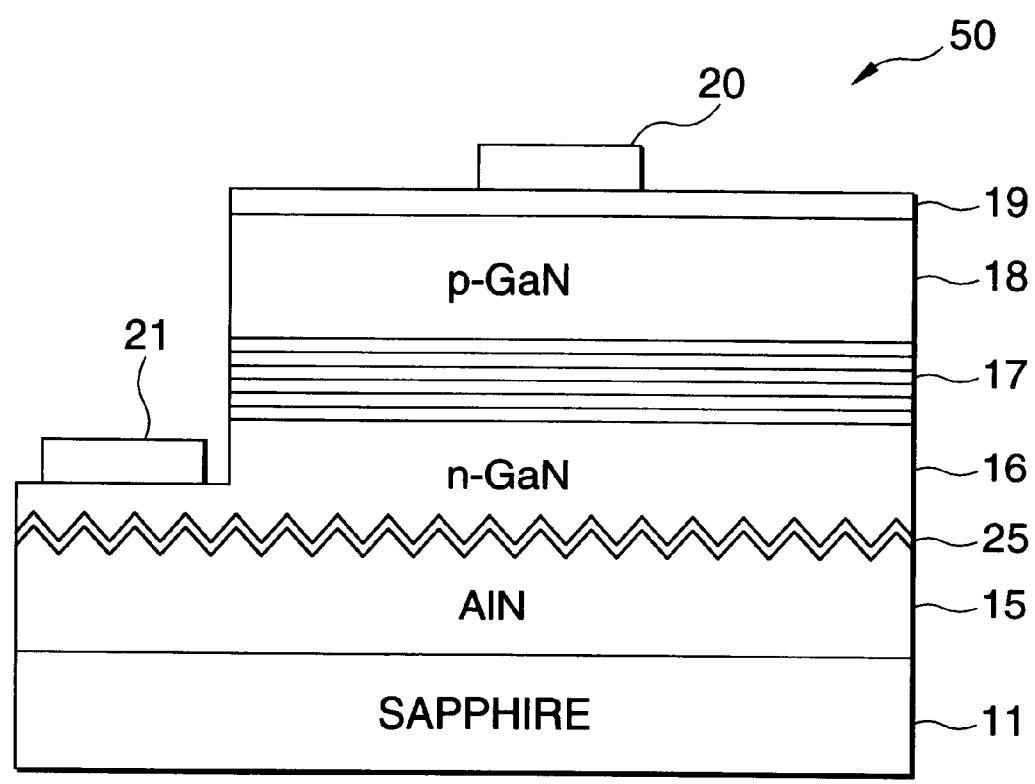
FIG. 11 shows a light-emitting diode according to a still another embodiment of the present invention.

FIG. 11 shows a light-emitting diode 50 according to a still another embodiment of the present invention. Same parts in FIG. 7 are referenced correspondingly. The description thereof will be therefore omitted.

In the light-emitting diode 50 according to this embodiment, a reflection layer 25 of TiN with a thickness of 0.3 µm is interposed between the undercoat layer 15 and the n-type layer 16. Other specifications are same as those of the embodiment in FIG. 7.

In order to produce this light-emitting diode, after the formation of the undercoat layer 15, the sample is transferred to a reactor of a DC magnetron sputtering apparatus. A DC magnetron sputtering method is carried out to form a reflection layer 25 of TiN. Then, the sample is transferred to an MOCVD apparatus. While the substrate temperature is kept at 1130° C., an n-type layer 16 is formed. Other steps are same as a method for producing the embodiment in FIG. 7.

Figure 12:
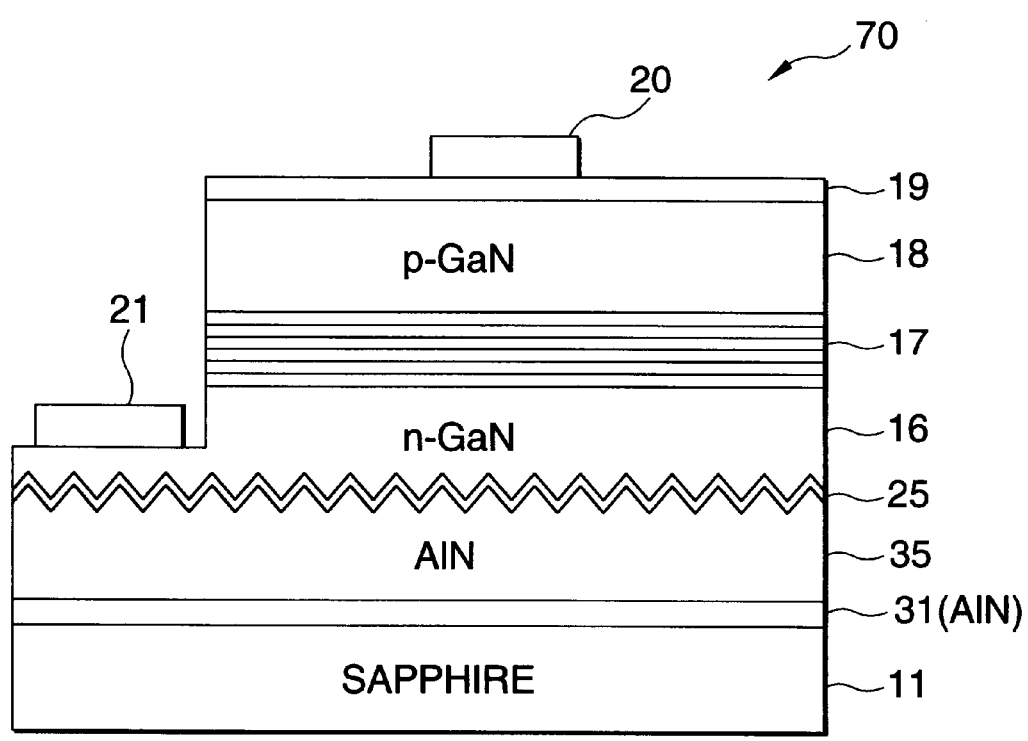
FIG. 12 shows a light-emitting diode according to a still another embodiment of the present invention.

FIG. 12 shows a light-emitting diode 70 according to a still another embodiment of the present invention. Same parts in FIG. 8 are referenced correspondingly. The description thereof will be therefore omitted.

In the light-emitting diode 70 according to this embodiment, a reflection layer 25 of TiN with a thickness of 0.3 µm is interposed between the undercoat layer 35 and the n-type layer 16. Other specifications are same as those of the embodiment in FIG. 8. Its producing method is same as that of the aforementioned embodiments.

Although this specification has been described while a light-emitting device is taken as an example, the present invention may be applied, of course, to various kinds of semiconductor devices and to laminates as intermediates of these devices.

The present invention is not limited to the description of the mode for carrying out the present invention and the description of the embodiment. It also includes various modifications that can be conceived easily by those skilled in the art, without departing from the scope of claim.

The following matters will be disclosed.

(21) A group III nitride compound semiconductor device comprising:
a substrate;
a group III nitride compound semiconductor layer having a device function; and
an undercoat layer formed between the substrate and the group III nitride semiconductor layer, the undercoat layer being mountain shaped in a section.

(22) A group III nitride compound semiconductor device comprising:
substrate;
a group III nitride compound semiconductor layer having a device function; and
an undercoat layer formed between the substrate and the group III nitride semiconductor layer, the undercoat layer having a surface with concave and convex portions, wherein a projected area ratio of the concave portions to the surface of the undercoat layer on a plane of projection is in a range of from 5 to 100%.

(23) A group III nitride compound semiconductor device according to the above paragraph (22), wherein the projected area ratio of the concave portions to the surface of the undercoat layer on a plane of protection is in a range of from 30 to 100%.

(24) A group III nitride compound semiconductor device according to the above paragraph (22), wherein the projected area ratio of the inclined faces to the surface of the undercoat layer on a plane of protection is in a range of from 70 to 100%.

(25) A group III nitride compound semiconductor device according to any one of the above paragraphs (21) through (24), wherein the undercoat layer is formed substantially of a single crystal.

(26) a group III nitride compound semiconductor device according to the above paragraph (25), wherein the undercoat layer is formed of a group III nitride compound semiconductor and formed on a sapphire substrate.

(27) A group III nitride compound semiconductor device according to the above paragraph (26), wherein the undercoat layer is formed of an AlN layer.

(28) A group III nitride compound semiconductor device according to the above paragraph (27), wherein the AlN layer has a thickness of from 0.2 to 3.0 μm.

(29) A group III nitride compound semiconductor device according to the above paragraph (27), wherein the AlN layer has a thickness of from 0.5 to 1.5 μm.

(29-1) A group III nitride compound semiconductor device according to any one of the above paragraphs (21) through (29), further comprising a sedimentary layer interposed between the undercoat layer and the substrate.

(30) A group III nitride compound semiconductor device according to any one of the above paragraphs (21) through (26), wherein the undercoat layer is formed of a silicon single crystal.

(41) A laminate comprising:
a substrate;
a group III nitride compound semiconductor layer having a device function; and
an undercoat layer formed between the substrate and the group III nitride semiconductor layer, the undercoat layer having a surface of a texture structure.

(42) A laminate comprising:
a substrate;
a group III nitride compound semiconductor layer having a device function; and
an undercoat layer formed between the substrate and the group III nitride semiconductor layer, the undercoat layer having a surface which is trapezoid shaped in section.

(43) A laminate comprising:
a substrate;
a group III nitride compound semiconductor layer having a device function; and
an undercoat layer formed between the substrate and the group III nitride semiconductor layer, the undercoat layer having a surface which is pit shaped.

(44) A laminate comprising:
a substrate;
a group III nitride compound semiconductor layer having a device function; and
an undercoat layer formed between the substrate and the group III nitride semiconductor layer, the undercoat layer having a surface containing inclined faces, wherein a projected area ratio of the inclined faces to the surface of the undercoat layer on a plane of projection is in a range of from 5 to 100%.

(45) A laminate according to the above paragraph (44), wherein the projected area ratio of the inclined faces to the surface of the undercoat layer on a plane of protection is in a range of from 30 to 100%.

(46) A laminate according to the above paragraph (44), wherein the projected area ratio of the inclined faces to the surface of the undercoat layer on a plane of projection is in a range of from 70 to 100%.

(47) A laminate according to any one of the above paragraphs (41) through (46), wherein the undercoat layer is formed substantially of a single crystal.

(48) A laminate according to the above paragraph (47), wherein the undercoat layer is formed of a group III nitride compound semiconductor and formed on a sapphire substrate.

(49) A laminate according to the above paragraph (48), wherein the undercoat layer is formed of an AlN layer.

(50) A laminate according to the above paragraph (49), wherein the AlN layer has a thickness of from 0.2 to 3.0 μm.

(51) A laminate according to the above paragraph (49), wherein the AlN layer has a thickness of from 0.5 to 1.5 μm.

(51-1) A laminate according to any one of the above paragraphs (41) through (51), further comprising a sedimentary layer interposed between the undercoat layer and the substrate.

(52) A laminate according to any one of the above paragraphs (41) through (46), wherein the undercoat layer is formed of a silicon single crystal.

(61) A laminate comprising:
a substrate;
a group III nitride compound semiconductor layer having a device function; and
an undercoat layer formed between the substrate and the group III nitride semiconductor layer, the undercoat layer being mountain shaped in section.

(62) A laminate comprising:
a substrate;
a group III nitride compound semiconductor layer having a device function; and
an undercoat layer formed between the substrate and the group III nitride semiconductor layer, the undercoat layer having a surface with concave and convex portions, wherein a projected area ratio of the concave portions to the surface of the undercoat layer on a plane of projection is in a range of from 5 to 100%.

(63) A laminate according to the above paragraph (62), wherein the projected area ratio of the concave portions to the surface of the undercoat layer on a plane of protection is in a range of from 30 to 100%.

(64) A laminate according to the above paragraph (62), wherein the projected area ratio of the inclined faces to the surface of the undercoat layer on a plane of protection is in a range of from 70 to 100%.

(65) A laminate according to any one of the above paragraphs (61) through (64), wherein the undercoat layer is formed substantially of a single crystal.

(66) A laminate according to the above paragraph (65), wherein the undercoat layer is formed of a group III nitride compound semiconductor and formed on a sapphire substrate.

(67) A laminate according to the above paragraph (66), wherein the undercoat layer is formed of an AlN layer.

(68) A laminate according to the above paragraph (67), wherein the AlN layer has a thickness of from 0.2 to 3.0 μm.

(69) A laminate according to the above paragraph (67), wherein the AlN layer has a thickness of from 0.5 to 1.5 μm.

(69-1) A laminate according to any one of the above paragraphs (61) through (69), further comprising a sedimentary layer interposed between the undercoat layer and the substrate.

(70) A laminate according to any one of the above paragraphs (61) through (66), wherein the undercoat layer is formed of a silicon single crystal.

(84) A laminate comprising:
a substrate;
a group III nitride compound semiconductor layer having a device function;
an undercoat layer formed between the substrate and the group III nitride semiconductor layer; and
a sedimentary layer formed between the undercoat layer and substrate, the undercoat layer being formed of a group III nitride compound semiconductor or a metal nitride compound semiconductor, the undercoat layer having a surface of a texture structure, a surface of a sectional trapezoid shape, or a surface of a pit shape, the sedimentary layer being formed of a group III nitride compound semiconductor.

(85) A laminate according to the above paragraph (84), wherein the sedimentary layer is formed as a multilayer containing at least first and second sedimentary layers and another group III nitride compound semiconductor layer is interposed between the first and second sedimentary layers.

(86) A laminate according to the above paragraph (84) or (85), wherein the sedimentary layer is formed of $Al_xGa_{1-x}N$ ($0 \leq X \leq 1$) and formed at a temperature lower than or equal to that of the undercoat layer.

(87) A laminate according to the above paragraph (84) or (85), wherein the sedimentary layer is formed of a metal nitride compound semiconductor and formed at a temperature lower than or equal to that of the undercoat layer.

(88) A laminate according to the above paragraph (86), wherein the sedimentary layer is formed of an AlN layer.

(89) A laminate according to any one of the above paragraphs (84) through (88), wherein the substrate is formed of sapphire.

(90) A laminate according to the above paragraph (89), wherein the sedimentary layer is formed on face a of the sapphire substrate.

(100) A laminate comprising:
a substrate;
an undercoat layer formed on the substrate and made of a group III nitride compound semiconductor, the undercoat layer having a surface formed as a texture structure or shaped like trapezoids in section, or like pits;
a reflection layer formed on the surface of the undercoat layer and made of nitride of at least one kind of metal selected from the group consisting of titanium, zirconium, hafnium and tantalum, the reflection layer having a surface shape formed in accordance with the surface shape of the undercoat layer; and
a group III nitride compound semiconductor layer formed on the reflection layer.

(101) A laminate according to the paragraph (100), wherein the reflection layer is made of titanium nitride. (102) A laminate according to the paragraph (100) or (101), wherein the undercoat layer is made of $Al_xGa_{1-x}N$ ($0 \leq x \leq 1$).

(103) A laminate according to the paragraph (102), wherein the undercoat layer is made of AlN.

(104) A laminate according to the paragraph (100) or (101), wherein the undercoat layer is made of InGaAlN.

(105) A laminate according to the paragraph (100) or (101), wherein the undercoat layer is made of InAlN or InGaN.

(106) A laminate according to any one of the paragraphs (100) through (105), wherein the substrate is made of sapphire or silicon single crystal.

(107) A laminate according to any one of the paragraph (100) through (106), further comprising a sedimentary layer interposed between the undercoat layer and the substrate.

(108) A laminate according to the paragraph (100), wherein: the substrate is made of sapphire; the undercoat layer is made of AlN and having a surface formed as a texture structure; and the reflection layer is made of titanium nitride.

What is claimed is:

1. A method of manufacturing a group III nitride compound semiconductor device, the method comprising:
   providing a substrate;
   forming a group III nitride compound semiconductor layer having a device function; and
   forming an undercoat layer between said substrate and said group III nitride semiconductor layer, said undercoat layer having a surface of a peak and trough structure.

2. A method according to claim 1, wherein said undercoat layer is formed substantially of a single crystal.

3. A method according to claim 2, wherein said undercoat layer is formed of a group III nitride compound semiconductor and formed on a sapphire substrate.

4. A method according to claim 1, wherein said undercoat layer is made of $Al_xGa_{1-x}N$ ($0 \leq x \leq 1$).

5. A method according to claim 4, wherein said undercoat layer is formed of an AlN layer.

6. A method according to claim 5, wherein said AlN layer has a thickness of from 0.2 to 3.0 μm.

7. A method according to claim 5, wherein said AlN layer has a thickness of from 0.5 to 1.5 μm.

8. A method according to claim 1, wherein said undercoat layer is formed of a silicon single crystal.

9. A method according to claim 1, further comprising forming a sedimentary layer interposed between said undercoat layer and said substrate.

10. A method according to claim 1, wherein said substrate is made of one of sapphire, silicon single crystal and silicon carbide single crystal.

11. A method according to claim 1, further comprising forming a reflection layer on said surface of said undercoat layer and made of nitride of at least one kind of metal selected from the group consisting of titanium, zirconium, hafnium and tantalum said reflection layer having a surface shape formed in accordance with a surface shape of said undercoat layer.

12. A method according to claim 11, wherein said reflection layer is made of titanium nitride.

13. A method according to claim 11, wherein said substrate is made of sapphire, said undercoat layer is made of AlN and having a surface formed as a peak and trough structure, and said reflection layer is made of titanium nitride.

14. A method according to claim 1, wherein the peak and trough structure surface is formed over substantially a whole surface of the substrate.

15. A method according to claim 1, wherein the undercoat layer is formed by metal organic chemical vapor deposition.

16. A method of manufacturing a group III nitride compound semiconductor device, the method comprising:
providing a substrate;
forming a group III nitride compound semiconductor layer having a device function; and
forming an undercoat layer between said substrate and said group III nitride semiconductor layer, said undercoat layer having a surface which is trapezoid shaped in section.

17. A method according to claim 16, wherein said undercoat layer is formed substantially of a single crystal.

18. A method according to claim 17, wherein said undercoat layer is formed of a group III nitride compound semiconductor and formed on a sapphire substrate.

19. A method according to claim 16, wherein said undercoat layer is made of $Al_xGa_{1-x}N$ ($0 \leq x \leq 1$).

20. A method according to claim 19, wherein said undercoat layer is formed of an AlN layer.

21. A method according to claim 20, wherein said AlN layer has a thickness of from 0.2 to 3.0 $\mu$m.

22. A method according to claim 20, wherein said AlN layer has a thickness of from 0.5 to 1.5 $\mu$m.

23. A method according to claim 16, wherein said undercoat layer is formed of a silicon single crystal.

24. A method according to claim 16, further comprising forming a sedimentary layer interposed between said undercoat layer and said substrate.

25. A method according to claim 16, wherein said substrate is made of one of sapphire, silicon single crystal and silicon carbide single crystal.

26. A method according to claim 16, further comprising forming a reflection layer on said surface of said undercoat layer and made of nitride of at least one kind of metal selected from the group consisting of titanium, zirconium, hafnium and tantalum, said reflection layer having a surface shape formed in accordance with a surface shape of said undercoat layer.

27. A method according to claim 26, wherein said reflection layer is made of titanium nitride.

28. A method according to claim 26, wherein said substrate is made of sapphire, said undercoat layer is made of AlN and having a surface formed as a peak and trough structure, and said reflection layer is made of titanium nitride.

29. A method according to claim 16, wherein the trapezoid shaped surface is formed over substantially a whole surface of the substrate.

30. A method according to claim 16, wherein the undercoat layer is formed by metal organic chemical vapor deposition.

31. A method of manufacturing a group III nitride compound semiconductor device, the method comprising:
providing a substrate;
forming a group III nitride compound semiconductor layer having a device function; and
forming an undercoat layer between said substrate and said group III nitride semiconductor layer, said undercoat layer having a surface which is pit shaped.

32. A method according to claim 31, wherein said undercoat layer is formed substantially of a single crystal.

33. A method according to claim 32, wherein said undercoat layer is formed of a group III nitride compound semiconductor and formed on a sapphire substrate.

34. A method according to claim 31, wherein said undercoat layer is made of $Al_xGa_{1-x}N$ (023 $x \leq 1$).

35. A method according to claim 34, wherein said undercoat layer is formed of an AlN layer.

36. A method according to claim 35, wherein said AlN layer has a thickness of from 0.2 to 3.0 $\mu$m.

37. A method according to claim 35, wherein said AlN layer has a thickness of from 0.5 to 1.5 $\mu$m.

38. A method according to claim 31, wherein said undercoat layer is formed of a silicon single crystal.

39. A method according to claim 31, further comprising forming a sedimentary layer interposed between said undercoat layer and said substrate.

40. A method according to claim 31, wherein said substrate is made of sapphire or silicon single crystal.

41. A method according to claim 31, further comprising forming a reflection layer on said surface of said undercoat layer and made of nitride of at least one kind of metal selected from the group consisting of titanium, zirconium, hafnium and tantalum, said reflection layer having a surface shape formed in accordance with a surface shape of said undercoat layer.

42. A method according to claim 41, wherein said reflection layer is made of titanium nitride.

43. A method according to claim 41, wherein said substrate is made of sapphire, said undercoat layer is made of AlN and having a surface formed as a peak and trough structure, and said reflection layer is made of titanium nitride.

44. A method according to claim 31, wherein the pit shaped surface is formed over substantially a whole surface of the substrate.

45. A method according to claim 31, wherein the undercoat layer is formed by metal organic chemical vapor deposition.

46. A method of manufacturing a group III nitride compound semiconductor device comprising:
providing a substrate;
forming a group III nitride compound semiconductor layer having a device function; and
forming an undercoat layer between said substrate and said group III nitride semiconductor layer, said undercoat layer having a surface containing inclined faces, wherein a projected area ratio of said inclined faces to said surface of said undercoat layer on a plane of projection is in a range of from 5 to 100%.

47. A method according to claim 46, wherein the projected area ratio of said inclined faces to said surface of said undercoat layer on a plane of protection is in a range of from 30 to 100%.

48. A method according to claim 46, wherein the projected area ratio of said inclined faces to said surface of said undercoat layer on a plane of protection is in a range of from 70 to 100%.

49. A method according to claim 46, wherein said undercoat layer is formed substantially of a single crystal.

50. A method according to claim 49, wherein said undercoat layer is formed of a group III nitride compound semiconductor and formed on a sapphire substrate.

51. A method according to claim 46, wherein said undercoat layer is made of $Al_xGa_{1-x}N$ ($0 \leq x \leq 1$).

52. A method according to claim 51, wherein said undercoat layer is formed of an AlN layer.

53. A method according to claim 52, wherein said AlN layer has a thickness of from 0.2 to 3.0 $\mu$m.

54. A method according to claim 52, wherein said AlN layer has a thickness of from 0.5 to 1.5 $\mu$m.

55. A method according to claim 46, wherein said undercoat layer is formed of a silicon single crystal.

56. A method according to claim 46, further comprising forming a sedimentary layer interposed between said undercoat layer and said substrate.

57. A method according to claim 46, wherein said substrate is made of one of sapphire, silicon single crystal and silicon carbide single crystal.

58. A method according to claim 46, further comprising forming a reflection layer on said surface of said undercoat layer and made of nitride of at least one kind of metal selected from the group consisting of titanium, zirconium, hafnium and tantalum, said reflection layer having a surface shape formed in accordance with a surface shape of said undercoat layer.

59. A method according to claim 58, wherein said reflection layer is made of titanium nitride.

60. A method according to claim 58, wherein said substrate is made of sapphire, said undercoat layer is made of AlN and having a surface formed as a peak and trough structure, and said reflection layer is made of titanium nitride.

61. A method according to claim 46, wherein the undercoat layer is formed by metal organic chemical vapor deposition.

62. A method of manufacturing a group III nitride compound semiconductor device, the method comprising:

providing a substrate;

forming a group III nitride compound semiconductor layer having a device function;

forming an undercoat layer between said substrate and said group III nitride semiconductor layer; and forming a sedimentary layer formed between said undercoat layer and substrate, said undercoat layer being formed of a group III nitride compound semiconductor and having one of a surface of a peak and trough structure, a surface of a sectional trapezoid shape, and a surface of a pit shape, said sedimentary layer being formed of one of a group III nitride compound semiconductor and a metal nitride compound semiconductor.

63. A method according to claim 62, wherein said sedimentary layer is formed as a multilayer containing at least first and second sedimentary layers and another group III nitride compound semiconductor layer is interposed between said first and second sedimentary layers.

64. A method according to claim 62, wherein said sedimentary layer is formed of $Al_xGa_{1-x}N$ ($0 \leq X \leq 1$) and formed at a temperature lower than or equal to that of said undercoat layer.

65. A method according to claim 62, wherein said sedimentary layer is formed of a metal nitride compound semiconductor and formed at a temperature lower than or equal to that of said undercoat layer.

66. A method according to claim 62, wherein said undercoat layer is made of $Al_xGa_{1-x}N$ ($0 \leq x \leq 1$).

67. A method according to claim 66, wherein said sedimentary layer is formed of an AlN layer.

68. A method according to claim 67, wherein said substrate is formed of sapphire or silicon single crystal.

69. A method according to claim 68, wherein said sedimentary layer is formed on face a of said sapphire substrate.

70. A method according to claim 62, further comprising:

forming a reflection layer on said surface of said undercoat layer and made of nitride of at least one kind of metal selected from the group consisting of titanium, zirconium, hafnium and tantalum, said reflection layer having a surface shape formed in accordance with the surface shape of said undercoat layer.

71. A method according to claim 70, wherein said reflection layer is made of titanium nitride.

72. A method according to claim 70, wherein said substrate is made of sapphire, said undercoat layer is made of AlN and having a surface formed as a peak and trough structure, and said reflection layer is made of titanium nitride.

73. A method according to claim 62, wherein said one of a surface of peak and trough structure, trapezoid shape, and pit shape is formed over substantially a whole surface of the substrate.

74. A method according to claim 62, wherein the undercoat layer is formed by metal organic chemical vapor deposition.

* * * * *